United States Patent
Khvoenkova et al.

(10) Patent No.: US 9,103,194 B2
(45) Date of Patent: Aug. 11, 2015

(54) METHOD FOR CONSTRUCTING A FRACTURE NETWORK GRID FROM A VORONOI DIAGRAM

(75) Inventors: Nina Khvoenkova, Rueil-Malmaison (FR); Matthieu Delorme, Rueil-Malmaison (FR)

(73) Assignee: IFP Energies nouvelles, Rueil-Malmaison Cedex (FR)

( * ) Notice: Subject to any disclaimer, the term of this patent is extended or adjusted under 35 U.S.C. 154(b) by 514 days.

(21) Appl. No.: 13/479,353

(22) Filed: May 24, 2012

(65) Prior Publication Data

US 2013/0138406 A1 May 30, 2013

(30) Foreign Application Priority Data

Jun. 1, 2011 (FR) ..................................... 11 01686

(51) Int. Cl.
*G06G 7/48* (2006.01)
*E21B 41/00* (2006.01)
*G01V 11/00* (2006.01)

(52) U.S. Cl.
CPC ............ *E21B 41/0092* (2013.01); *G01V 11/00* (2013.01)

(58) Field of Classification Search
CPC ........................... E21B 41/0092; G01V 11/00
USPC ............................................ 703/2, 10; 702/6
See application file for complete search history.

(56) References Cited

U.S. PATENT DOCUMENTS

| | | | | |
|---|---|---|---|---|
| 7,634,395 | B2 * | 12/2009 | Flandrin et al. | 703/10 |
| 2003/0216898 | A1 * | 11/2003 | Basquet et al. | 703/10 |
| 2013/0035913 | A1 * | 2/2013 | Mishev et al. | 703/2 |

OTHER PUBLICATIONS

Ledoux. "Modelling Three-dimensional Fields in Geoscience with the Voronoi Diagram and its Dual"., Nov. 2006. 182 Pages.*
P. Koebe, Kontakprobleme der konformen Abbildung. Ber. Sächs, Akad, Wiss., Leipzig, Math.-Phys. Kl., 88:, 1936.
S.J. Fortune, A Sweepline Algorithm for Voronoi Diagrams, Algorithmica 2, 1987, pp. 153-174.
J.E. Warren et al. in "The Behavior of Naturally Fractured Reservoirs", Society of Petroleum Engineers Journal (Sep. 1963), 245-255.

* cited by examiner

*Primary Examiner* — Eunhee Kim
(74) *Attorney, Agent, or Firm* — Fitch Even Tabin & Flannery

(57) ABSTRACT

Method for optimizing the development of a fluid deposit using a fracture network grid constructed from a Voronoi diagram.
Based on observations of the deposit a discrete fracture network is constructed in which each fracture is represented by an isotropic polygonal finite plane in terms of its dynamic properties, a plane comprising segments of intersection with other network fractures. A Voronoi diagram is constructed on each fracture plane by positioning Voronoi cell centers on the segments of intersection, and the transmissivities are calculated between centers of neighboring cells from the ratio between the surface area of the neighboring cells and the distance between the neighboring cells. The cells and transmissivities can then be used to construct an image of the fluid deposit. Finally, this image and a flow simulator are used to optimize the development of the fluid deposit.

6 Claims, 5 Drawing Sheets

METHOD FOR CONSTRUCTING A FRACTURE NETWORK GRID FROM A VORONOI DIAGRAM

CROSS REFERENCE TO RELATED APPLICATION

Reference is made to French Patent Application Serial No. 11/01686, filed on Jun. 2, 2011, which application is incorporated herein by reference in its entirety.

BACKGROUND OF THE INVENTION

1. Field of the Invention

The present invention relates to the development of underground deposits, such as hydrocarbon deposits comprising a fracture network.

2. Description of the Prior Art

The petroleum industry, and more precisely petroleum deposit exploration and development, require that knowledge of the underground geology is as perfect as possible to efficiently provide an evaluation of reserves, a modeling of production or development management. In fact, determining the location of a production well or an injection well, the composition of the drilling mud, the completion characteristics, choosing a method of recovering hydrocarbons (such as water injection for example) and the parameters necessary for the implementation of this method (such as injection pressure, production rate, etc.) require good knowledge of the deposit. Knowledge of the deposit notably means knowing the petrophysical properties of the subsoil at any point in space, and being able to predict the flows likely to occur there.

To do this, for some time the petroleum industry has combined field (in situ) measurements with experimental modeling (performed in the laboratory) and/or numerical modeling (using software). Petroleum deposit modeling thus constitutes a technical step essential to any deposit exploration or development. The object of this modeling is to provide a description of the deposit.

Fractured reservoirs constitute an extreme type of heterogeneous reservoirs comprising two contrasting media, a matrix medium containing the major part of the oil in place and displaying low permeability, and a fractured medium representing less than 1% of the oil in place and highly conductive. The fractured medium itself may be complex, with different sets of fractures characterized by their respective density, length, orientation, inclination and opening. The fractured medium is all the fractures. The matrix medium is all the rock around the fractured medium.

The development of fractured reservoirs requires knowledge of the role of the fractures which is perfect as possible. What is referred to as a "fracture" is a plane discontinuity of very small thickness in relation to its extent, representing a rupture plane in a rock of the deposit. On the one hand, knowledge of the distribution and of the behavior of these fractures can be used to optimize the location and the spacing between wells to be drilled through the oil-bearing deposit. On the other hand, the geometry of the fracture network conditions fluid displacement, both at the scale of the reservoir and at the local scale where it determines elementary matrix blocks in which the oil is trapped. Knowing the distribution of the fractures is therefore also very useful, at a later stage, for reservoir engineers seeking to calibrate the models they construct for simulating deposits in order to reproduce or to predict past or future production curves. For these purposes, geoscientists have three-dimensional images of deposits, for locating a large number of fractures.

Thus, to reproduce or predict (i.e. "simulate") the production of hydrocarbons on starting production from a deposit according to a given production scenario (characterized by the position of the wells, the recovery method, etc.), reservoir engineers use calculation software, called a "reservoir simulator" (or "flow simulator"), which calculates the flows and the changes in pressure within the reservoir represented by the reservoir model (reservoir image). The results of these calculations enable them to predict and optimize the deposit in terms of flow rate and/or amount of hydrocarbons that are recovered. Calculating the behavior of the reservoir according to a given production scenario constitutes a "reservoir simulation."

For carrying out simulations of flow around a well or at the scale of a few reservoir grid cells (~$km^2$), taking into account a geologically representative discrete fracture network, it is necessary to construct a grid of the matrix medium (rock) and a grid of the fractured medium. The latter must be adapted to the geometric (location of diffuse faults and fractures in three dimensions) and dynamic heterogeneities, since the fractured medium is often much more conductive of fluids than the matrix medium. These simulation zones, if they are fractured, may have up to a million fractures, with sizes varying from one to several hundred meters, and with very variable geometries: dip, strike, shape.

This step is very useful for the hydrodynamic calibration of fracture models. In fact, the discontinuity of hydraulic properties (dominant permeability in the fractures and storage capacity in the matrix) often leads to using the double-medium approach (homogenized properties) on reservoir models (hectometric grid cell). These models are based on the assumption that the representative volume element (RVE) is attained in the grid cell and the fracturing of the medium is sufficiently large to be able to apply homogenization methods (stochastic periodicity of fracturing is used, for example).

As part of the development of petroleum deposits, discrete flow simulation methods are used, notably, for the scaling of permeabilities (at the scale of a reservoir cell) and for dynamic tests (a zone of interest (ZOI) of small size compared to that of the reservoir). The calculation times appear to be crucial since the calculation is often performed sequentially and many times in optimization loops. It is known that in the case of dense fracturing (very connected fractures), analytical methods are applicable while in the case of a low connectivity index, the numerical simulation on a discrete fracture network (DFN) is necessary.

The numerical model, i.e. the matrix of transmissivities relating to the various objects (diffuse faults, grid cells of the matrix medium) must respect a number of criteria:

It must be applicable to a large number of fractures (several thousand fracture nodes);

It must restore the connectivity of the fracture network;

It must be adaptable in order to take into account all fracture models (several scales of fracturing, 3D disordered fractures, tight faults, dynamic properties over time, etc.);

It must be the shape of the fractures (any plane convex polygons or ellipses) and the heterogeneities of intersection between 3D fractures must be taken into account in the plane gridding of each of the fractures;

The number of simulation nodes must be restricted for being able to use a numerical solver;

It must be quick and inexpensive in memory (usable on a normal workstation and not just on a supercomputer).

With such requirements, conventional (finite element or finite volume) grids and the methods derived from them for a local construction of transmissivities, are not applicable due to an excessively high number of nodes necessary for the simulation.

The known technique implemented in the FracaFlow™ software (IFP Energies nouvelles, France) which overcomes these limitations by using a physical approach based on analytical solutions of plane flow problems. The fractures here are assumed to be constrained by geological beds (they cross them entirely) and to be subvertical. A fracture is considered constrained to the beds if it breaks off on changes of geological bed. These assumptions ensure that all intersections take place on any intermediate plane parallel to the geological layers. In the midplane of each geological bed, the nodes are placed on the intersections (a point) of the fractures on the plane (a matrix node and a fracture node at the same place). The vertical connections are borne by the fractures crossing several layers and the volumes associated with the nodes are calculated as the set of points (on the 2D plane, propagated vertically to the thickness of the layer) closest to the node (in the medium considered).

This method reaches its limits when the fractures are not constrained to the beds and/or the dip of the fractures is not vertical. The intersections are consequently not present on each intermediate plane and the vertical connectivity cannot be honored. By increasing the number of intermediate planes, the error can be reduced (without ever being correct in the case of subhorizontal fractures) but the number of nodes increases significantly and exceeds the limits imposed by the solvers.

SUMMARY OF THE INVENTION

The invention relates to a method for constructing a fracture network grid and thus constructing an image of the deposit. The invention also relates to a method using this image for optimizing the management of such development by use of a prediction of fluid flows that may occur through this medium, for simulating hydrocarbon production according to various production scenarios.

Thus, the invention relates to a method for optimizing the development of a fluid deposit traversed by a fracture network, in which a discrete fracture network (DFN) is constructed, and a grid is constructed on this discrete network to overcome the limitations of prior methods and to take into account fractures not necessarily constrained to the beds and subhorizontal fractures (as in some materials such as granite), while limiting the number of grid cells. To achieve this, the invention is based on the use of a Voronoi diagram on each fracture plane, in order to construct a grid of the fractured medium that gives a good estimate of the volumes present at each node and the flow lines representing fluid movement from node to node.

One advantage of the invention is that it can be used to solve the flow system in each fracture plane analytically, with the aid of the Voronoi diagram, instead of using finite elements in each plane, as in prior techniques. In fact, these latter techniques lead to flow systems which cannot be solved in actual fractured deposit conditions, as they have 10,000 to 100,000 nodes on each fracture. However, according to the invention, the grids only comprise 3 or 4 nodes at the intersections, enabling millions of fractures to be processed in contrast to the other methods. It is therefore possible to optimize the development of the deposit.

Generally speaking, the invention relates to a method for optimizing the development of a fluid deposit traversed by a fracture network, in which the deposit is discretized into a set of grid cells, based on observations of the deposit a discrete fracture network (DFN) is constructed in each grid cell, in which each fracture is represented by an isotropic polygonal finite plane in terms of its dynamic properties. The comprises at least one segment of intersection corresponding to an intersection between the fracture and another fracture of the network. The method comprises the following steps:
   a) a Voronoi diagram is constructed on each fracture plane by positioning Voronoi cell centers on the segments of intersection;
   b) transmissivities are calculated between centers of neighboring cells from the ratio between the surface area of the neighboring cells and the distance between the neighboring cells;
   c) the cells and the transmissivities are used for constructing an image of the fluid deposit;
   d) the image of the fluid deposit and a flow simulator are used for optimizing the development of said fluid deposit.

According to the invention the centers of Voronoi cells can be positioned on the segments of intersection, by applying the rule that each segment of intersection is at least discretized by two Voronoi intermediate nodes at each end of the segment and is refined in the case of near segments and segments that cross one another.

The number of cells can be limited by proceeding to an assembly of Voronoi cells belonging to the same segment of intersection, while the cell from the assembly remains connected. In this case, the transmissivity between two cells from the assembly is equal to the sum of the transmissivities through the boundaries separating them according to the conservation of flow.

Other features and advantages of the method according to the invention will become clear on reading the following description of non-restrictive examples of embodiments, referring to the accompanying figures and disclosed below.

DETAILED DESCRIPTION OF THE INVENTION

Figure 1:
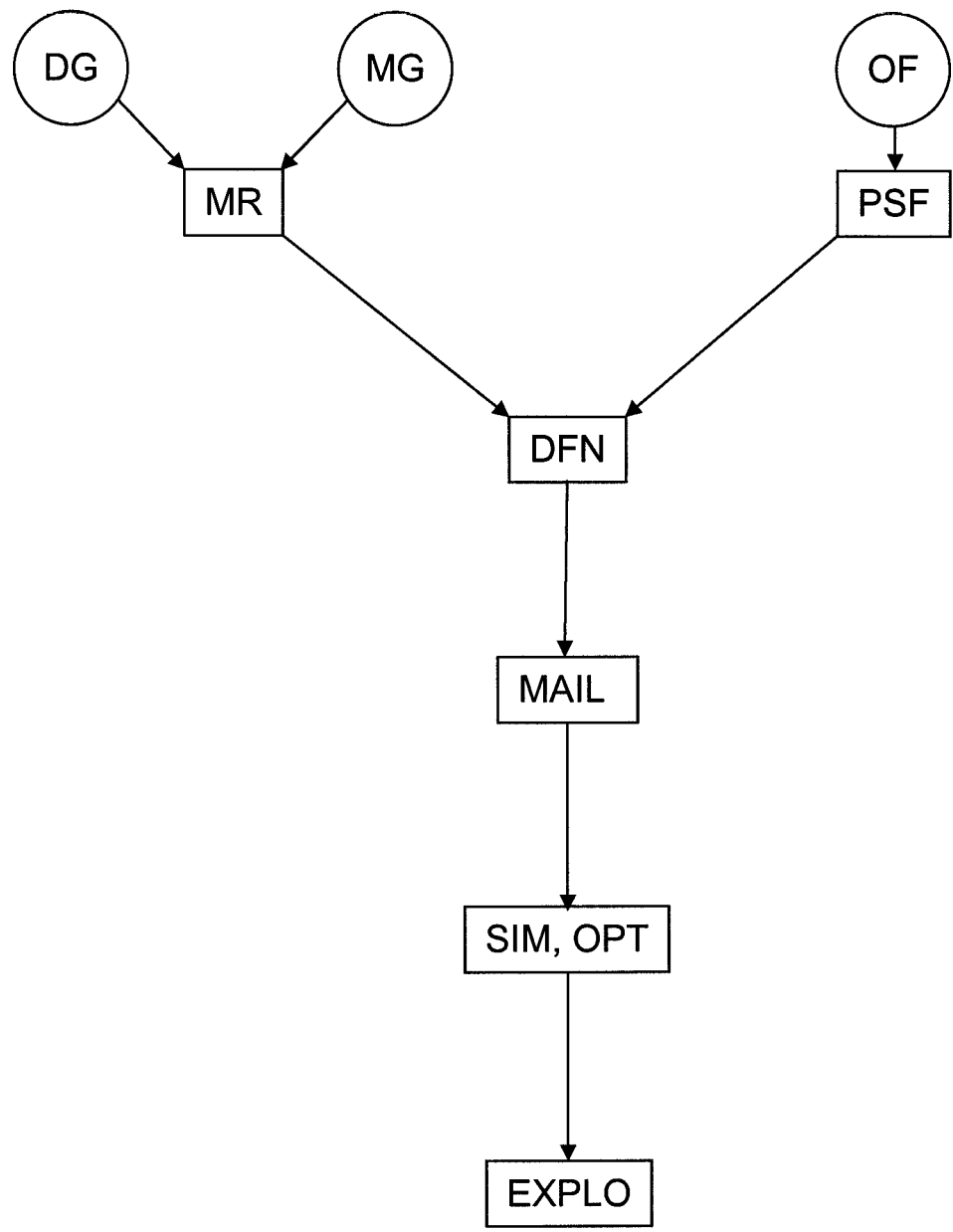
FIG. 1 illustrates the different steps of the method according to the invention.

The method according to the invention for optimizing the development of a deposit, using the method according to the invention of constructing a fracture network grid, comprises five steps with the first four being implemented by a computer, as illustrated in FIG. 1 in which:
- Step 1 is a discretiazation of the deposit into a set of grid cells (MR);
- Step 2 is a modeling of the fracture network by a discrete fracture model (DFN);
- Step 3 is a construction of a grid of the discrete fracture model (MAIL);
- Step 4 is a simulation of fluid flows (SIM) and optimization of production conditions of the deposit (OPT);
- Step 5 is an optimized (global) development of the deposit (EXPLO)

1—Discretization of the Deposit into a Set of Grid Cells (MR)

For some time the petroleum industry has combined field (in situ) measurements with experimental modeling (performed in the laboratory) and/or numerical modeling (using software). Petroleum deposit modeling thus constitutes a technical step essential to any deposit exploration or development. Such modeling is intended to provide a description of the deposit, characterized by the structure/geometry and petrophysical properties of the deposits or geological formations of which it is composed.

This modeling is based on an image of the deposit, constructed by discretizing the deposit into a set of grid cells. Each of these grid cells represents a given volume of the deposit, and constitutes a volume element of the deposit. The set of grid cells constitutes a discrete image of the deposit, termed a reservoir model.

Many software tools are known for constructing such a reservoir model, based on data (DG) and measurements (MG) relating to the deposit.

Figure 2:
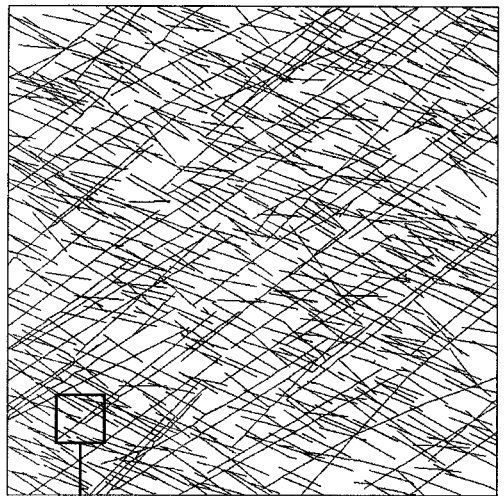
FIG. 2 illustrates an embodiment of a fracture/fault network at the scale of a reservoir.

FIG. 2 illustrates a two-dimensional view of a reservoir model. Fractures are represented by lines. Grid cells are not represented.

2—Modeling of the Fracture Network

In order to take into account the role of the fracture network in the simulation of flows within the deposit, it is necessary to associate a fracture modeling with each of these volume elements (grid cells of the reservoir model).

Fracture Characterization

The statistical characterization of the reservoir involves carrying out direct and indirect observations (OF) of the reservoir. For this, 1) well cores are extracted from the reservoir on which a statistical study of the intersected fractures is performed; 2) characteristic outcrops of the reservoir are provided which have the advantage of providing a large-scale view of the fracture network; and 3) seismic images are provided to identify major geological events.

These measurements enable the fractures to be characterized by statistical parameters (PSF) representing their density, length, orientation, inclination and respective opening, and of course, their distribution within the reservoir.

At the conclusion of this step of fracture characterization, statistical parameters (PSF) describe the fracture networks from which realistic images of actual (geological) networks can be reconstructed (generated) at the scale of each of the grid cells of the reservoir model considered (simulation domain).

The objective of the characterization and modeling of the deposit's fracture network, is to provide a fracture model validated on the local flows around wells. This fracture model is then extended to the scale of the reservoir in order to carry out production simulations. To do this, flow properties are associated with each grid cell of the reservoir model (MR) (permeability tensor, porosity) of both media (fracture and matrix).

These properties can be determined either directly from the statistical parameters (PSF) describing the fracture networks, or from a discrete fracture network (DFN) obtained from the statistical parameters (PSF).

Figure 3:
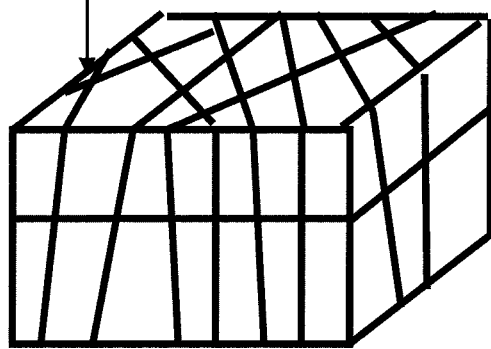
FIG. 3 illustrates a discrete fracture network (DFN).

Construction of a Discrete Fracture Network (DFN)—FIGS. 2 and 3

From a reservoir model of the deposit under study, a detailed image (DFN) is associated in each cell of the internal complexity of the fracture network which is as faithful as possible to the direct and indirect observations of the reservoir. FIG. 2 illustrates an embodiment of a fracture/fault network at the scale of a reservoir. Each grid cell of the reservoir model thus represents a discrete fracture network delimiting a set of porous matrix blocks, of irregular shapes and sizes, delimited by fractures. Such an image is represented in FIG. 3. This discrete fracture network constitutes a representative image of the actual fracture network delimiting the matrix blocks.

For constructing a discrete fracture network in each grid cell of a reservoir model, known modeling software can be used, such as FRACAFlow® software (IFP Energies nouvelles, France). This software uses the statistical parameters determined in the fracture characterization step.

Thus, within the discrete fracture network (DFN), each fracture is represented by an isotropic polygonal finite plane in terms of its properties. That is any property of the fault (dynamic, hydraulic such as transmissivities) is homogeneous in this plane. This plane may comprise at least one segment of intersection corresponding to an intersection between the fracture and another fracture of the network.

3—Construction of a Grid of the Discrete Fracture Model (MAIL)

The method according to the invention can be used to construct a fine grid on any 3D discrete fracture network with an optimum number of nodes which is close to the number of intersections between the connected fractures. The connectivity of the discrete fracture network (DFN) at the scale of the study (a zone of interest of a few thousand square meters) is respected in order to simulate flows. This method of gridding each fracture plane in 3D space is applicable to all problems of flow in a 2D plane with discontinuities in hydraulic properties. It essentially comprises two steps:
- e) a Voronoi diagram is constructed on each fracture plane by positioning Voronoi cell centers on the segments of intersection; and
- f) the transmissivities are calculated between the centers of neighboring cells from the ratio between the surface area of neighboring cells and the distance between the neighboring cells.

The fractured grid cells are constructed from a Voronoi diagram of segments to limit the exchange space between two fracture nodes to a single homogeneous medium while locally respecting the physics of flow in a homogeneous medium. The discontinuity due to any intersection of fractures is modeled using the construction of the grid. Once the nodes are positioned, a simple physical formulation is used for calculating the transmissivities which are the connection terms between the nodes. The method, applied here to the grid of the 3D fractured medium applies to any 3D problem of segments with disordered heterogeneities connected by homogeneous property planes.

Physically, it is assumed that the intersection between two fractures is a heterogeneity and the damage is assumed to be greater in each of the planes relating to the respective fractures. However, in a homogeneous medium, the fluid will take the path that requires the least energy for moving from one point to another. Since it is assumed that the pressure gradient along the intersection is lower than in the fracture (higher permeability), to pass from one intersection to another, the fluid uses the path of shortest distance between the two segments of intersection. This leads to, for each fracture computing the 2D segment Voronoi diagram on the intersections. In fact, this diagram has the advantage of delimiting the zones of influence of each fracture.

1. The grid of the fractured medium is constructed on the DFN, in order to have the fewest possible nodes. To fully honor connectivity, the fracture nodes are placed on the intersections of the fractures in 3D (one or more nodes per segment of intersection).
2. The isopressures, orthogonal to the pressure gradient and therefore to the flow lines in each homogeneous fracture plane, are assumed parallel to the intersections.
3. The grid cells are constructed from a Voronoi diagram of segments on each fracture plane. This construction has the advantage of:
    limiting the exchange space between two fracture nodes to a single homogeneous medium (the plane of a fracture);
    locally respecting the orthogonality between the flow line (between two nodes) and the boundary of the cells; and
    facilitating the approximate calculation of the pressure gradient between the nodes along the boundary.

Figure 4:
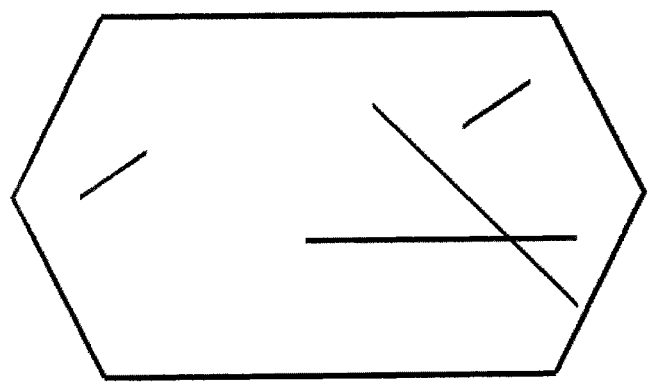
FIG. 4 illustrates an example of a fracture plane composed of six vertices and four coplanar segments of intersection including a multiple intersection.
Figure 5:
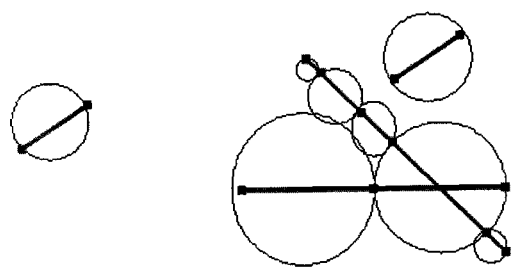
FIG. 5 illustrates the creation of Voronoi cell centers for the example chosen (FIG. 4), according to Koebe's theorem.
Figure 6:
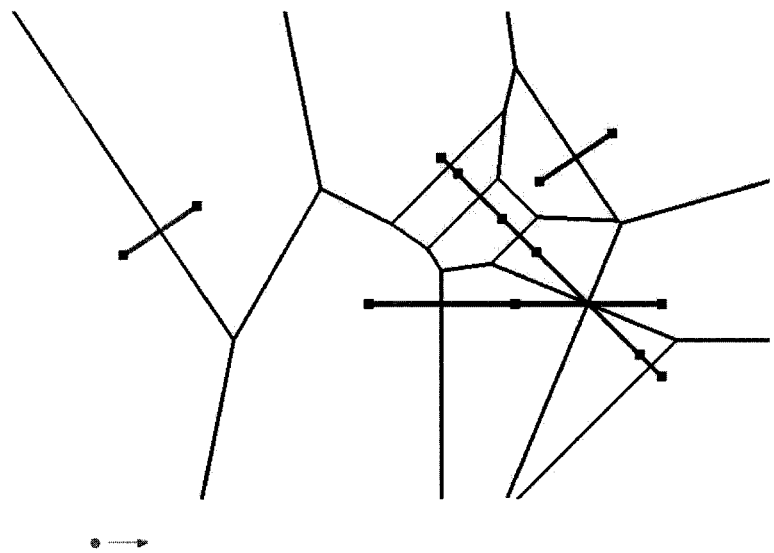
FIG. 6 illustrates the construction, from FIG. 5, of the infinite Voronoi diagram, with determination of boundaries and neighboring cells.
Figure 7:
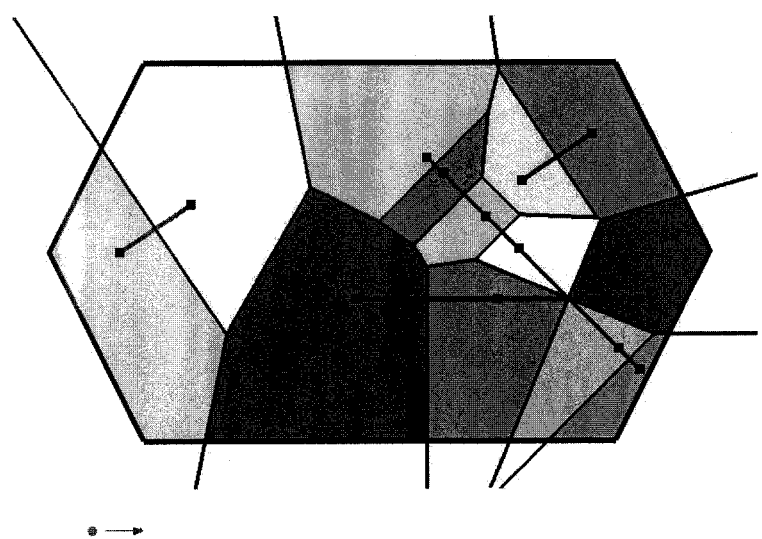
FIG. 7 illustrates the result of the "clipping" applied to the image of FIG. 6.

According to the invention, each fracture is represented by an isotropic polygonal finite plane in terms of its dynamic properties. Each plane may comprise at least one segment of intersection corresponding to an intersection between the fracture and another fracture of the network (DFN). FIG. 4 illustrates an example composed of a fracture with six vertices and four coplanar segments of intersection including a multiple intersection. The method for gridding this plane comprises the following steps:

1. For each intersection, a fracture node is created which is a node at the center of each intersection while keeping the information on the coordinates of both ends. In the case of multiple intersections (at least three fractures intersect at the same point), the initial node is replaced at the center of the segment by two nodes on each side of the point. The purpose of this preprocessing is to ensure the connectivity of every fracture grid cell.
2. The Voronoi diagram is constructed on each fracture plane from the segments of intersection by applying Koebe's theorem. Each segment is at least discretized by two intermediate Voronoi nodes at each end and is refined when segments are too close or cross one another. This construction can be broken down into the following steps:
    i. The set of Voronoi cell centers is created which are points satisfying the Koebe-Andreev-Thurston "Kissing disks" theorem (P. Koebe. Kontaktprobleme der konformen Abbildung. Ber. Sächs. Akad. Wiss. Leipzig, Math. Phys. Kl., 88:141-164, 1936.) On each intersection contained in the plane of the fracture each segment is at least discretized by two intermediate Voronoi nodes at each end of the segment, and is refined when segments cross one another and when segments are too close. Proximity depends on the distance between points for which it is estimated that these two points coincide. This is a parameter of geometrical precision that can be defined according to the size of the study domain notably in relation to the size of the fractures). FIG. 5 illustrates the creation of Voronoi cell centers for the example chosen (FIG. 4), according to Koebe's theorem. Here it is ensured that for each triplet of points, the circle whose center is at the middle of two of the points does not contain the third point.
    ii. The Voronoi diagram is constructed on these points using S. Fortune's algorithm (S. J. Fortune, *A sweepline algorithm for Voronoi diagrams, Algorithmica* 2 (1987), 153-174.) which are proven to be the fastest on an infinite 2D plane. FIG. 6 illustrates the construction of the infinite Voronoi diagram, with determination of the boundaries and neighboring cells.
    iii. "Clipping" is performed of the infinite Voronoi diagram with respect to the finite polygon defining the fracture. "Clipping" designates the act of confining the result of a view to a given domain. At this stage, the Voronoi cells are convex and the line passing through the centers of two neighboring cells is orthogonal to the boundary separating them. by using such a geometry it is easier to approximate the pressure gradient between the nodes along the boundary. FIG. 7 illustrates the result of the "clipping" applied to the image of FIG. 6.
3. Fine calculation of the transmissivities is performed between the centers of neighboring cells of the diagram.

The transmissivities (Tff) are calculated between the centers of neighboring cells from the ratio between the surface area (Sc) of the neighboring cells and the distance (Dc) between the neighboring cells:

$$Tff = K \cdot Sc/Dc$$

with K being the permeability of the fracture in which the flow occurs

4. Assembly of Voronoi cells

Figure 8:
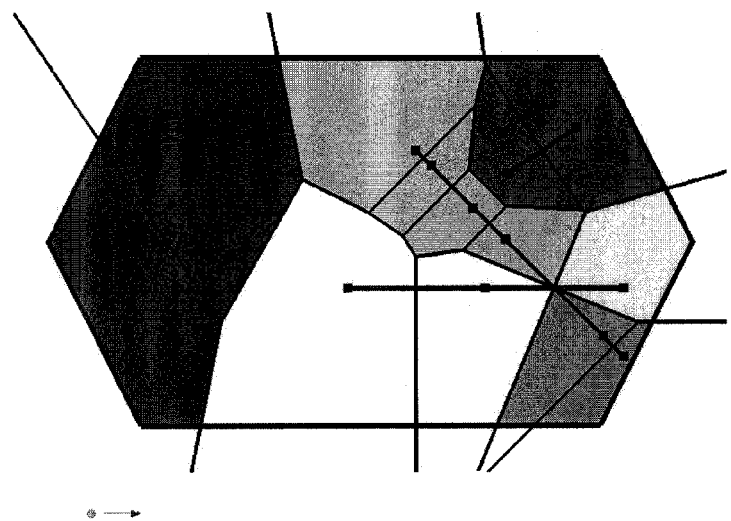
FIG. 8 illustrates the assembly of Voronoi cells for creating "fracture nodes" (here six "fracture nodes" each characterized by a color).

The damage at the intersection between two fractures is assumed to be greater than in the respective fracture planes. This results in accounting for any discontinuities of conductivities on the fracture plane locally along intersections. The lines of isopressure in each fracture plane then correspond to the lines of equidistance between the intersection paths. The Voronoi diagram of segments meets this criterion and the cells of this diagram become the fracture grid cells (connected by construction) associated with the node. In order to limit the number of nodes, an assembly of Voronoi cells proceeds in which the cells belong to the same segment of intersection while the cell remains connected (i.e. the cells belong to the same segment and there is no multiple intersection). FIG. 8 illustrates the assembly of Voronoi cells for creating "fracture nodes" (here six "fracture nodes" each characterized by a color).

Then, the volumes are added up with the transmissivity between two "fracture nodes" being equal to the sum of the transmissivities through the boundaries separating them according to the conservation of flow. If a fracture node A contains several Voronoi points $P_{Ai}$ and a node B contains several Voronoi points $B_j$, the transmissivity between two fracture nodes A and B is calculated as the sum of the transmissivities between all pairs of Voronoi cells belonging to the node and having a common face (FIG. 8).

$$T_{AB} = \sum_{i,j} T(P_{A_i}, T_{B_j})$$

Figure 9:
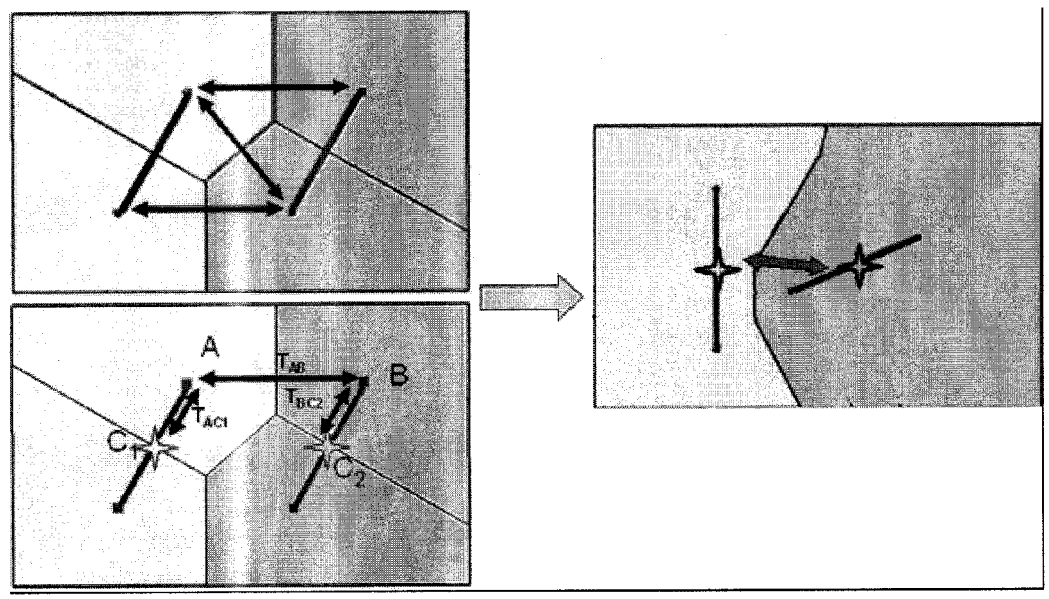
FIG. 9 illustrates the assembly of Voronoi cells in the case where the "fracture node" does not correspond to the Voronoi nodes, with calculation of a correction of the set of transmissivities.

In the case of an assembly, since the "fracture node" does not correspond to Voronoi nodes, a correction is made to the set of transmissivities to account for the changes in distance for the exchanges of fluids. This modification depends on the permeability assigned to each fracture intersection (which may vary according to the model, from that of the calculation plane to infinity). In fact, it may be desired to model a different permeability along the intersection of two fractures, without it being infinite, with respect to that which defines each of the fracture planes. In order to find the correction associated with the finite conductivity of a segment of intersection, a transmissivity is added between the center C1 of the node (or geometrically speaking of the segment) A and a Voronoi point $P_{A_i}$. Thus if two (or more) Voronoi nodes belong to the same fracture node (FIG. 9) with center C1, the transmissivity $T_{S1S2}$ between a node A and a node B is calculated as follows:

$$T_{AB}^{corr} = \left( \frac{1}{T_{C_1 A_i}} + \frac{1}{T_{A_i B_j}} + \frac{1}{T_{C_2 B_j}} \right)^{-1}$$

This correction removes the assumption of infinite conductivity along the fracture if the choice of the model imposes $T_{C_1 A_i} \neq 0$.

To be implemented in software and executed on a computer, the algorithm inputs can be the following:

Zone of Interest is 3D parallelepiped given by the bounding box (Xmin, Ymin, Zmin, Xmax, Ymax, Zmax) of the simulation domain.

List of fractures are 3D convex plane polygons given by ordered lists of vertices with their isotropic hydraulic properties in each fracture plane which are permeability, thickness, compressibility.

Table of connectivity at the limit conditions shows to which cluster of maximum size a fracture belongs. A cluster is a group of fractures for which there is a path connecting each of the members.

List of 3D segments of intersection and for each fracture is a list of pointers to the corresponding intersections. Each fracture intersection and vertex is expressed, by change of base, in a reference local to the fracture. Thus, the general 3D problem is reduced to a series of 2D plane problems.

This new technique of gridding the fractured medium can be used to construct a fine grid on the discrete fracture network with an optimum number of nodes, close to the number of intersections between the connected fractures.

The connectivity of the DFN at the scale of the study (a zone of interest of a few thousand square meters) is respected in order to simulate flows.

The 3D cells of the fractured grid are constructed from a Voronoi diagram of segments discretized according to Koebe's theorem on each fracture plane. This construction has the advantage of:

limiting the exchange space between two fracture nodes to a single homogeneous medium (the plane of a fracture), locally respecting orthogonality between the flow line (between two nodes) and the boundary of the cells and easily calculating the pressure gradient between the nodes along the boundary, taking into account the discontinuity due to any intersection of fractures, and which is broken down into simple, easily parallelizable steps.

This new technique of gridding the fractured medium therefore constitutes a semi-analytical method using a Voronoi diagram for reducing the number of nodes necessary for flow simulation on a discrete fracture network. Accordingly, the method according to the invention is applicable to larger calculation areas than prior methods.

The results of this method of gridding (the nodes, their associated volume and transmissivities) can then be used in a double medium for simulating well tests, interference tests or a calculation of equivalent permeability. This method, applied here to the grid of the 3D fractured medium, applies to any homogeneous plane problem populated by segments with heterogeneities.

The next step determines the flow properties of the initial fractures, then calibrates these properties by simulating well tests on discrete local flow models, which are inherited from a realistic image of the actual (geological) fracture network at the scale of the reservoir. Although only covering a limited area (drainage area) around the well, such a well test simulation model still comprises a large number of calculation nodes if the fracture network is dense. Consequently, the size of the systems to solve and/or duration of the calculations often remain prohibitive.

4— Calibration of the Flow Properties of Fractures

The next step is the calibration of the flow properties of fractures (conductivity and opening of fractures), locally around wells. The latter, if necessary, requires the simulation of well tests.

This type of calibration is well known. For example, the method described in French Patent 2 787 219 can be used. The flow responses of some wells are simulated (transient or pseudo-steady-state flow tests, interference, flow metering, etc.) on these models extracted from the geological model giving a discrete (realistic) image of the fractures supplying these wells. Then, the result of the simulation is compared with the actual measurements made at the wells. If the results differ, the statistical parameters (PSF) describing the fracture networks are modified, then the initial fracture flow properties are redetermined, and a new simulation is performed. The operation is repeated until the simulation results and measurements converge.

The results of these simulations can be used to calibrate (estimate) the geometry and flow properties of fractures, such as the conductivities of the fracture networks of the reservoir being studied and the openings.

5—Simulation of Fluid Flows (SIM) and Optimization of Production Conditions of the Deposit (OPT)

At this stage, the reservoir engineer then has the data required for constructing the flow model at the scale of the reservoir. The image is composed of the discretization of the deposit in a set of grid cells (MR). Each grid cell comprises a modeling of the fracture network by a discrete fracture model (DFN) and each fracture of this discrete fracture model (DFN) is gridded by the Voronoi cells with identified transmissivities.

The fractured reservoir simulations often adopt the "double porosity" approach, which is proposed, for example, by J. E. Warren et al. in "The Behavior of Naturally Fractured Reservoirs", SPE Journal (September 1963), 245-255, according to which each volume element (grid cell of the reservoir model) of the fractured reservoir is modeled in the form of a set of identical parallelepiped blocks, which are called equivalent blocks, and are delimited by an orthogonal system of continuous uniform fractures oriented along the principal directions of flow. Fluid flow at the scale of the reservoir, takes place only through the fractures, and fluid exchanges occur locally between the fractures and the matrix blocks. The reservoir engineer can, for example, use the methods described in the following patent documents, applied to the whole reservoir this time: FR 2 757 947 corresponding to U.S. Pat. No. 6,023,656, FR 2 757 957 corresponding to U.S. Pat. No. 6,064,944 and EP 2 037 080.

The reservoir engineer chooses a production method, such as the recovery by water injection method, for example, for which the optimum implementation scenario then remains to be specified for the field under consideration. The definition of an optimum water injection scenario will, for example, set the number and location (position and spacing) of the injector and producer wells in order to best account for the impact of the fractures on the progress of the fluids within the reservoir.

According to the chosen scenario, the double-medium image of the deposit, and the formula linking the mass and/or energy exchange flow to the matrix-fracture potential difference, it is then possible to simulate the expected hydrocarbon production, by the "double-medium flow simulator" (software).

At any instant of time t of the simulated production, from the input data E(t) (fixed or simulated time variable data), and from the formula linking the exchange flow (f) to the potential difference ($\Delta\phi$), the simulator solves the set of equations specific to each grid cell and each of the two grids of the model (equations involving the matrix-fracture exchange formula described above) and thus supplies the solution values of the unknowns S(t) (saturations, pressures, concentrations, temperature, etc.) at this instant t. This solution provides knowledge of the quantities of oil produced and the state of the deposit (distribution of pressures, saturations, etc.) at the instant considered.

6—Optimized Development of the Deposit (EXPLO)

The image of the fluid deposit and a flow simulator are used for optimizing the development of said fluid deposit. By selecting various scenarios, characterized, for example, by diverse respective locations of the injector and producer wells, and by simulating the hydrocarbon production for each of them according to step 5, the scenario can be selected for optimizing the production of the fractured deposit considered according to the technical and economic criteria selected.

Then the deposit is developed according to this scenario for optimizing the production of the deposit.

The invention claimed is:

1. A method for optimizing the development of a fluid deposit traversed by a network containing fractures in which, based on observations of the deposit, the deposit is discretized into a set of grid cells with each cell including a discrete fracture network, each fracture being represented by an isotropic polygonal finite plane in terms of dynamic properties thereof with the plane comprising at least one segment of intersection corresponding to an intersection between fractures of the network, comprising:
   constructing a Voronoi diagram on each fracture plane by positioning Voronoi cell centers on the at least one segment of intersection;
   calculating transmissivities between centers of neighboring cells from a ratio between surface areas of the neighboring cells and a distance between the neighboring cells;
   using the cells and the transmissivities for constructing an image of the fluid deposit; and
   using the image of the fluid deposit and a flow simulator to optimize the development of the fluid deposit.

2. A method according to claim 1, comprising positioning centers of Voronoi cells on the at least one segment of intersection, by discretizing each segment of intersection with at least two Voronoi intermediate nodes at each end of the at least one segment and for segments spaced by a distance less than a predefined value and for segments that cross one another.

3. A method according to claim 1, wherein a number of cells is limited by assembling Voronoi cells belonging to a same segment of intersection while the cells from the assembly remain connected.

4. A method according to claim 2, wherein a number of cells is limited by assembling Voronoi cells belonging to a same segment of intersection while the cells from the assembly remain connected.

5. A method according to claim 3, wherein transmissivity between two cells from the assembly is equal to a sum of the transmissivities through boundaries separating the two cells according to conservation of flow.

6. A method according to claim 4, wherein transmissivity between two cells from the assembly is equal to a sum of the transmissivities through boundaries separating the two cells according to conservation of flow.

* * * * *